(12) United States Patent
Castellano et al.

(10) Patent No.: US 6,734,688 B1
(45) Date of Patent: May 11, 2004

(54) LOW COMPLIANCE TESTER INTERFACE

(75) Inventors: Derek Castellano, Simi Valley, CA (US); Keith Breinlinger, Hampstead, NH (US); Kevin P. Manning, Newbury Park, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/571,563

(22) Filed: May 15, 2000

(51) Int. Cl.$^7$ ................................................ G01R 31/00
(52) U.S. Cl. ........................................ 324/754; 324/757
(58) Field of Search ................................ 324/754, 757, 324/758, 761, 158.1; 439/66–67, 91

(56) References Cited

U.S. PATENT DOCUMENTS

| | | | |
|---|---|---|---|
| 4,445,735 A | 5/1984 | Bonnefoy ................. 339/17 M |
| 4,793,814 A | 12/1988 | Zifcak et al. .................. 439/66 |
| 4,862,075 A | * 8/1989 | Choi et al. ............... 324/158 F |
| 4,870,356 A | 9/1989 | Tingley ................... 324/158 F |
| 4,932,883 A | 6/1990 | Hsia et al. ..................... 439/66 |
| 5,049,084 A | 9/1991 | Bakke ......................... 439/66 |
| 5,071,359 A | 12/1991 | Arnio et al. .................. 439/91 |
| 5,092,774 A | 3/1992 | Milan .......................... 439/66 |
| 5,096,426 A | 3/1992 | Simpson et al. .............. 439/66 |
| 5,245,751 A | 9/1993 | Locke et al. .................. 29/852 |
| 5,264,787 A | * 11/1993 | Woith et al. ............. 324/158 P |
| 5,309,324 A | 5/1994 | Herandez et al. ............ 361/734 |
| 5,385,477 A | 1/1995 | Vaynkof et al. ............... 439/66 |
| 5,434,452 A | 7/1995 | Higgins, III ................. 257/773 |
| 5,635,846 A | 6/1997 | Beaman et al. .............. 324/754 |
| 5,642,054 A | * 6/1997 | Pasiecznik, Jr. ............. 324/754 |
| 5,821,763 A | 10/1998 | Beaman et al. .............. 324/754 |
| 5,821,764 A | 10/1998 | Slocum et al. ............... 324/758 |
| 5,847,571 A | * 12/1998 | Liu et al. ..................... 324/754 |
| 5,904,580 A | 5/1999 | Kozel et al. ................... 439/66 |
| 6,027,346 A | 2/2000 | Sinsheimer et al. ........... 439/66 |
| 6,037,787 A | 3/2000 | Corwith ....................... 324/754 |
| 6,300,780 B1 | 10/2001 | Beaman et al. |

* cited by examiner

*Primary Examiner*—Kamand Cuneo
*Assistant Examiner*—Paresh Patel
(74) *Attorney, Agent, or Firm*—Teradyne Legal Dept.

(57) ABSTRACT

Automatic test equipment adapted for testing a plurality of devices-under-test (DUTs) is disclosed. The automatic test equipment includes a mainframe computer and a test head coupled to the mainframe computer. The test head includes a low-profile tester interface having a first interface board and a device board. The device board engages contact points on the DUTs and includes a topside. A hard stop is mounted to the first interface board and defines a reference plane. The hard stop is adapted to engage the device board topside to vertically fix the device board, positionally with respect to the first interface board. The automatic test equipment further includes a compliant interconnect array adapted for compression between the first interface board and the device board.

5 Claims, 4 Drawing Sheets

LOW COMPLIANCE TESTER INTERFACE

FIELD OF THE INVENTION

The invention relates generally to automatic test equipment and more particularly a low compliance tester interface for reliably coupling a semiconductor tester to one or more semiconductor devices-under-test.

BACKGROUND OF THE INVENTION

In the automatic test equipment industry, one of the fundamental challenges to testing a plurality of semiconductor devices in parallel involves routing and connecting thousands of ground, signal and power paths (collectively defining tester channels) from the tester channel cards to the device(s)-under-test (DUTs). As shown generally in FIG. 1, a semiconductor tester 10 usually includes a mainframe is computer 12 that interacts with a test head 14. The test head houses the tester channel cards that generate and receive test signals for application to and receipt from the individual DUT contacts formed on a semiconductor wafer 16. In order to facilitate the eventual connection between each DUT pin and a tester channel, the signal paths from the test head to the DUT are routed through a tester interface 18. The interface directs the paths from the low-density test head area to the very high dense probe array disposed proximate the DUTs.

Referring now to FIG. 2, one conventional tester interface for application to wafer-level testing, generally designated 20, includes a prober interface board (PIB) 22 comprising a multi-layer circuit board. The PIB includes upper surface contacts (not shown) for coupling to respective channel card coaxial cables (not shown). Lower surface contacts disposed on the PIB underside are arranged in a high-density annular array, and connected to the upper contacts by respective internal electrical paths.

Further referring to FIG. 2, the underside PIB contacts correspond to a matching array of connection points on a probecard 24. Like the PIB, the probecard comprises a multi-layer circuit board that generally routes the signal, ground and power paths from its outer periphery to a centrally disposed probe array 26. A compliant interconnect array 28 electrically couples the PIB and probecard together. The probe array, during test, touches down onto the semiconductor wafer (not shown) to effect the tester connection to one or more semiconductor devices formed thereon.

Conventional probecards are typically formed in a laminated structure that includes, for example, thirty or more layers, and measures around 0.250 inch thick. Because of the manufacturing complexities associated with such structures, tolerance deviations in the probecard thickness on the order of around +/−0.025 inch are common. Since the surface area of a typical probecard is on the order of approximately 120 square inches, planarity and thickness variations pose a significant challenge to interface designs that require thousands of board-to-board connections over much of the surface area. Moreover, as shown in FIG. 2, during operation the probecard tends to deflect near the center portion because of the large number of electrical connections between the wafer and probe array that, taken as a whole, exert a substantial force on the order of around a hundred pounds. Usually, a stiffener 29 is mounted to the probecard in an effort to reduce the deflection. Unfortunately, many areas where electrical contacts touch cannot be backed-up by a stiffener.

The planarity and deflection variations of the PIB and probecard typically have an effect on the assembled tolerance of the vertical, or "Z"-dimension, stack height. Conventionally, the stack height is defined with respect to the bottom of the probecard, thereby including the uncertainty of the probecard thickness in the overall height. Keeping the overall stack height within specified tolerances is very important to ensure acceptable tester performance.

In an effort to compensate for the variations in probecard and PIB thickness and planarities introduced by manufacturing processes and operation induced deflection, and to ensure a constant connection between the PIB and the probecard, ATE manufacturers have typically implemented a tester interface that employs a conventional pogo pin-based interconnect array. As is well known in the art, conventional pogo pins are barrel-shaped contacts having spring-loaded tips that provide a relatively large mechanical compliance up to around 0.125 inch. Having the large compliance allows the assembly of the interface stack to include the PIB and probecard tolerance deviations.

Although pogo pins generally provide a relatively long compliance length, the overall cost and reliability of conventional pogo pins are believed undersirable for the next-generation of semiconductor testers. This belief stems from findings that pogo pin tips are often prone to breakage, possibly substantially affecting a tester's reliability factor in terms of mean-time-between-failure (MTBF). Moreover, the relatively long travel capability, or compliance, for conventional pogo pins undesirably affects the impedance controlled transmission line characteristic for individual signals. As semiconductor device speeds increase beyond 250 MHz, transmission line quality becomes much more important.

What is needed and heretofore unavailable is a low compliance, low cost tester interface having the capability of reliably making tester board-to-board connections. Moreover, the need exists for such an interface that requires little to no modifications to user-controlled hardware. The tester interface of the present invention satisfies these needs.

SUMMARY OF THE INVENTION

The tester interface of the present invention provides a low compliance and low-cost alternative to conventional high-compliance pogo pin schemes while dramatically increasing the reliability of connections. This allows for testing of more devices in parallel, contributing to lower test costs per device.

To realize the foregoing advantages, the invention in one form comprises automatic test equipment adapted for testing a plurality of devices-under-test (DUTs). The automatic test equipment includes a mainframe computer and a test head coupled to the mainframe computer. The test head includes a low-profile tester interface having a first interface board and a device board. The device board engages contact points on the DUTs and includes a topside. A hard stop is mounted to the first interface board and defines a reference plane. The hard stop is adapted to engage the device board topside to vertically fix the device board positionally with respect to the first interface board. The automatic test equipment further includes a compliant interconnect array adapted for compression between the first interface board and the device board.

In another form, the invention comprises a method of interfacing a probecard to a prober interface board formed with a bard stop. The method includes the step of first anchoring a top-side stiffener to the probe card. The stiffener is formed with a predetermined reference height and projects vertically in the direction of the prober interface board. The top-side stiffener also includes a defined reference plane for engaging the hard stop. The method further includes the steps of interposing a low-profile interconnect array between the probecard and the prober interface board; and compressing the probecard against the interconnect array until stopped by the hard stop.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
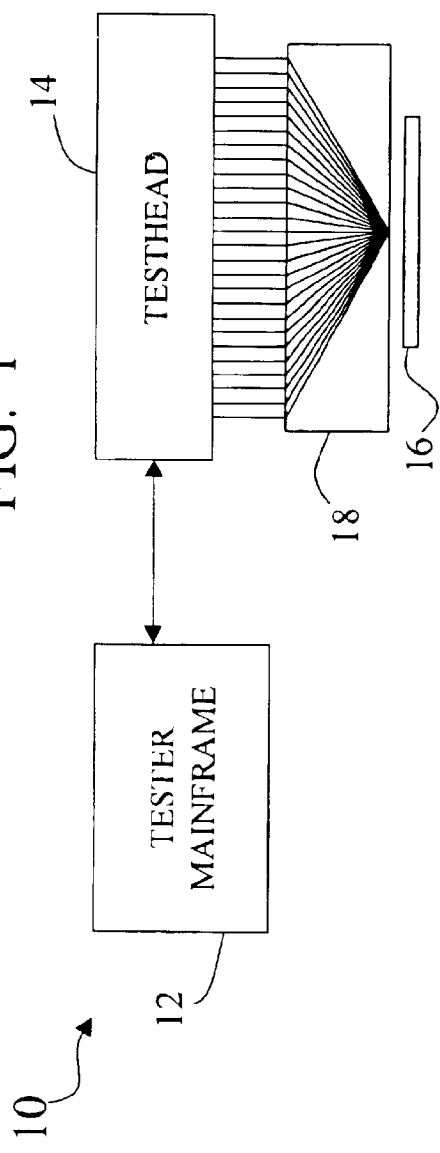
FIG. 1 is a block diagram of a semiconductor tester.
Figure 2:
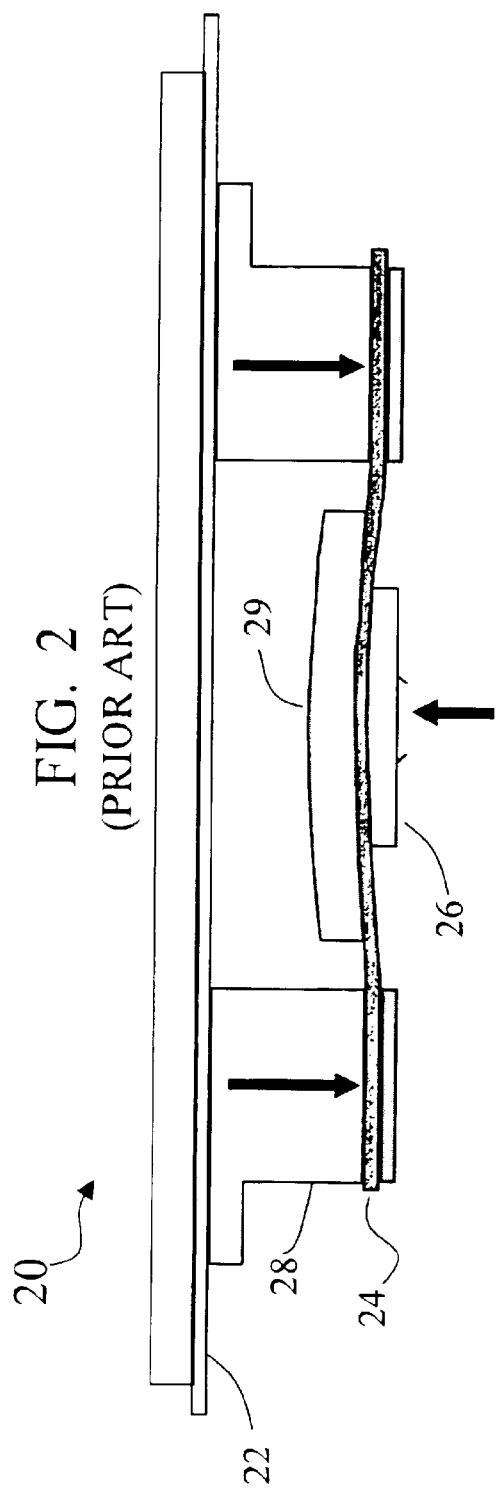
FIG. 2 is a cross-sectional view of a conventional wafer-level tester interface.
Figure 3:
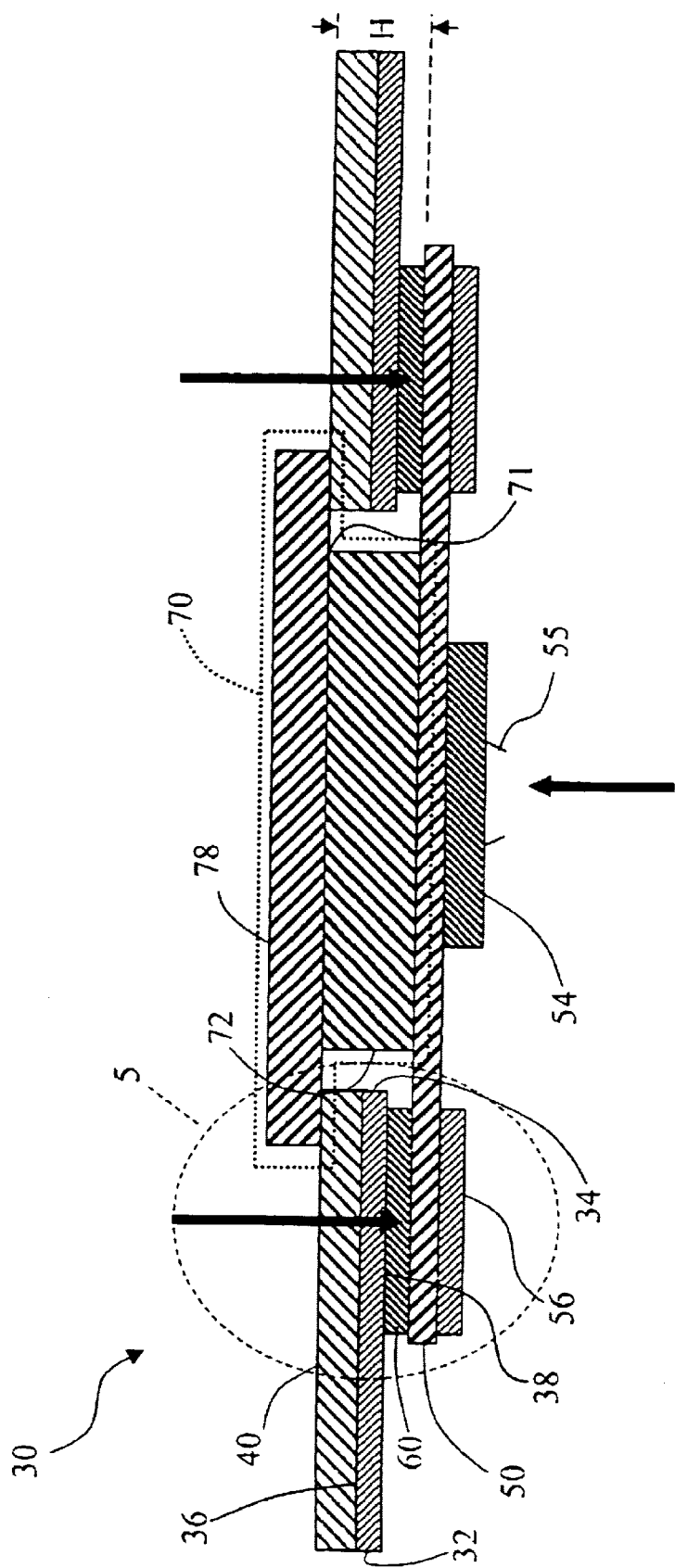
FIG. 3 is a cross-sectional view of a tester interface according to one form of the present invention.

Referring now to FIG. 3, a tester interface for use with a semiconductor parallel tester, generally designated 30, implements a hard stop 70 that abuts the central portion of a device board 50 to minimize the board's operational deflection while simultaneously defining a z-stack reference plane. The reference plane fixes the device board vertical position with respect to a first interface board 32. Establishing a top-side reference plane that sets the vertical position of the device board in this manner enables the use of a low-profile interconnect array 60 that employs a plurality of disposable, inexpensive and tight-pitch elastomeric connectors 66 (FIG. 4).

Figure 4:
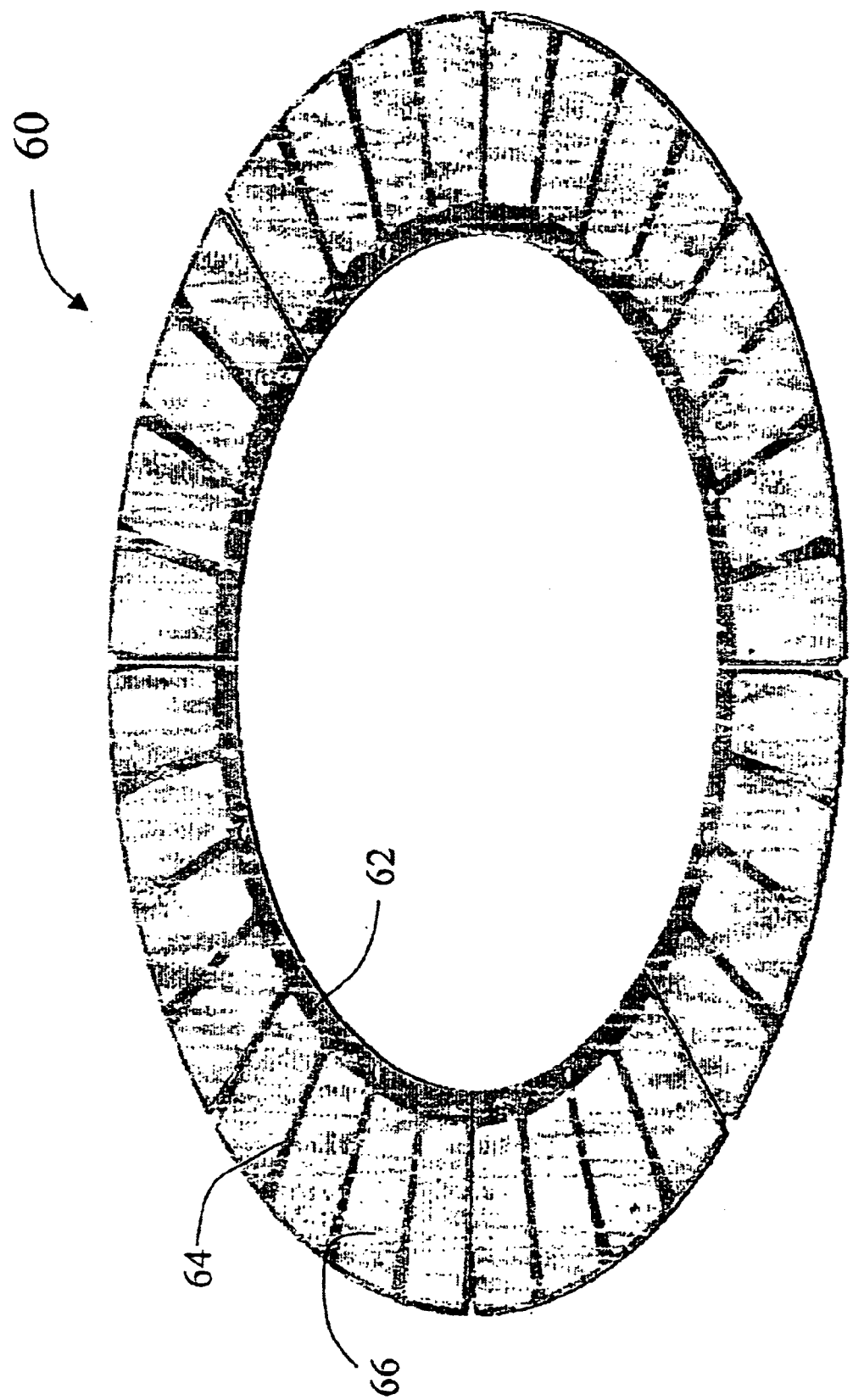
FIG. 4 is a perspective view of the compliant interconnect ring of FIG. 3.

Referring to FIGS. 3 and 4, for wafer probing applications, the first interface board 32 comprises a prober interface board (PIB). The PIB couples to the device board 50 via the compliant interconnect array 60 (FIG. 4) and is formed with a central opening 34 and a first planar surface 36 that mounts a relatively low-density contact array (not shown) for coupling to respective signal, ground and power leads (not shown). A second planar surface 38 disposed opposite the first surface mounts a relatively high-density array of contact pads (not shown). Internal electrical paths and conductive vias formed on multiple layers of the board connect the first surface contacts to the second surface contact array.

To inhibit deflection of the PIB 32 during operation, a stiffener 40 mounts to the PIB and is constructed to roughly match the dimensions thereof. The stiffener is preferably formed of aluminum and includes a centrally disposed opening aligned concentrically with the PIB opening 34.

Referring again to FIGS. 3 and 5, the device board 50 for wafer-probe applications comprises a probecard adapted for interfacing with the high-pitch array of contacts disposed on the PIB 32. The probecard generally includes a top surface 52 that mounts a peripheral array of contacts (not shown) that match and align with the array of contact pads disposed on the PIB. Conductive paths are formed in the probecard that couple the array to a fine-pitch contact matrix disposed in the central portion of the probecard known as a probe array 54. The probe array employs precision probes 55 for repetitively touching-down on predefined areas of a semiconductor wafer (not shown), enabling the testing of multiple devices in parallel.

Like the PIB 32, the probecard 50 is paired with a stiffener 56 mounted to the probecard underside for inhibiting deflection during operation. For some applications, however, an underside stiffener may not be necessary for the probe card.

Figure 5:
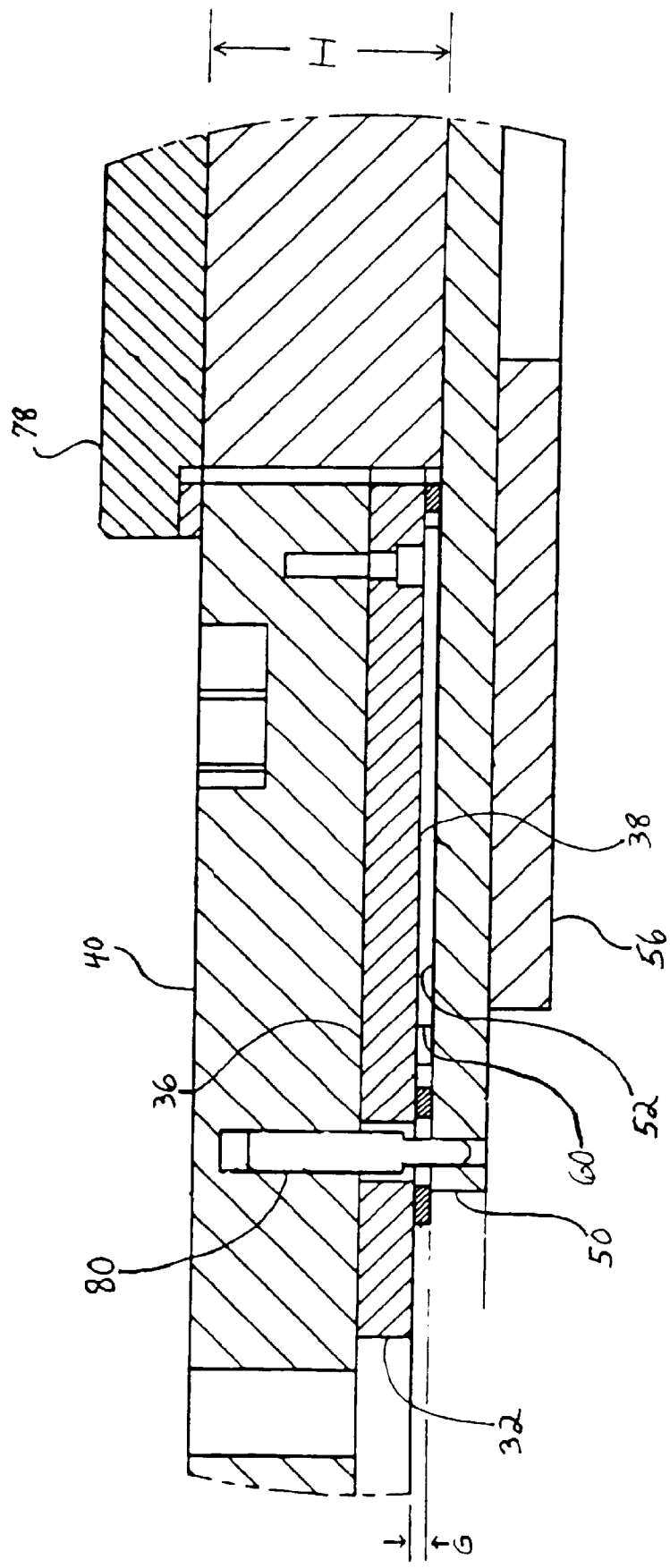
FIG. 5 is an enlarged cross-sectional view of area 5—5 of FIG. 3.

Referring now to FIGS. 3, 4 and 5, the compliant interconnect array 60 is adapted for axial alignment between the PIB 32 and the probecard 50. With specific reference to FIG. 4, the array includes a ring-shaped and segmented retainer 62 formed with a plurality of windows 64 detachably mounting respective elastomeric connectors 66. The connectors preferably take the form of those manufactured under the trademark ISOCON, by Circuit Components Inc., Tempe, Ariz. Each connector forms a "petal" in a corresponding window, and is secured thereto by a suitable silicone adhesive or sealant. The connectors, while relatively thin at around 0.075 to 0.85 inch, provide a maximum compliance on the order of approximately 0.030 to 0.038 inch.

To establish a high tolerance reference plane for vertically positioning the probecard with respect to the PIB, enabling the use of the low-compliance elastomeric connectors 66, a hard stop, generally designated 70, is employed on the top-side surface of the probecard. The hard stop includes a top-side stiffener 72 preferably mounted to the probecard and having a body that projects vertically from the probecard surface a predetermined height H, and terminating in a top surface that defines a reference plane at 71. The hard stop also includes a rigid flat plate 78 that overlies the top-side stiffener 72 and anchors to the PIB stiffener 40.

Prior to operation, the PIB 32, probecard 50, and interconnect array 60 are aligned by the use of alignment pins 80 (FIG. 5) to enable the "making and breaking" of the densely packed individual electrical connections. Moreover, the stack height of the interface, known as the Z-stack height, is pre-set through the use of a fixture (not shown) to properly set an interconnect array gap G (FIG. 5). The gap defines the height of the interconnect array, which preferably exhibits a low profile, for example, of no higher than around 0.076 to 0.085 inch. The fixture simulates the installation of the probecard, which is usually carried out at the semiconductor manufacturing facility. Because the hard stop stiffener height can be more accurately controlled than the probecard thickness, the compliance tolerance can be reduced.

In operation, the tester interface 30 is employed in a semiconductor memory tester capable of testing, for example, one-hundred and twenty-eight (or more) semiconductor memory devices in parallel. Such a high number of devices requires upwards of approximately 12,000 to 15,000 signal, ground and power connections leading from the tester test head to the probe array. Providing a high level of parallelism maximizes the level of throughput for the semiconductor manufacturer, thereby reducing unit test costs.

During test, the tester interface experiences cyclic loading due to the periodic touch-down of the probe array with respect to the wafer under test. Under typical conditions, the load at the probe array is approximately sixty to one-hundred pounds. However, due to the implementation of the top-side stiffener 70 and the hard-stop 78, axial deflection of the probecard is substantially minimized. Even more importantly, since the vertical position of the probecard is fixed with respect to the hard stop reference plane, the uncertainty in probecard thickness has no effect on the compliance requirement. This directly lowers the required compliance of the interconnect ring 60, enabling the use of the relatively inexpensive and tight-pitch connection scheme such as that available with elastomeric connectors.

Over the course of continuous operation spanning, for example, thousands of hours, maintenance conditions may arise that require the replacement of one or more connectors within the interconnect ring. Because of the minimal cost of the elastomeric material, and the relative ease of replacement of any individual connector set, replacement costs are substantially mitigated.

Those skilled in the art will appreciate the many benefits and advantages afforded by the present invention. Of particular importance is the ability to use inexpensive, and high-pitch elastomeric connectors for interfacing the PIB to the probecard. This not only enables parallel testing of potentially hundreds of semiconductor devices in parallel, but does so without the need for conventional high-compliance pogo pins. By eliminating expensive high-compliance elements from the interface equation, tester reliability time is maximized, greatly contributing to reduced test costs.

While the invention has been particularly shown and described with reference to the preferred embodiments thereof, it will be understood by those skilled in the art that various changes in form and detail may be made therein without departing from the spirit and scope of the invention. For example, while the present invention has been described in detail for use in wafer-probe applications, minor modifications could be made to employ the interface in packaged-device level applications. In such circumstances, the first interface board would comprise a handler interface board (HIB), while the device board would comprise a device interface board (DIB). Moreover, rather than coupling the tester to a prober, the interface would be coupling the tester to a handler.

Additionally, the description of the hard stop included herein specifically discloses a multi-part structure, while it could also comprise an integral unit having, for example, a flange to couple to the first interface board and a body projecting vertically from the flange a predetermined height.

What is claimed is:

1. Automatic test equipment adapted for testing a plurality of devices-under-test (DUTs), the automatic test equipment including:
   a mainframe computer; and
   a test head coupled to the mainframe computer, the test head including a low-profile tester interface, the low-profile tester interface including
   a first interface board,
   a device board for engaging contact points on the DUTs, and having a topside,
   a hard stop mounted to the first interface board and defining a reference plane, the hard stop adapted to engage the device board topside to vertically fix the device board positionally with respect to the first interface board; and
   a compliant interconnect array adapted for compression between the first interface board and the device board the interconnect array having a retainer and a plurality of connectors, the plurality of connectors providing compliance no greater than 0.038 inches and comprising a stack height no greater than 0.085 inch.

2. Automatic test equipment according to claim 1 wherein:
   said hard stop further includes a topside stiffener projecting vertically from said reference plane a predetermined height.

3. Automatic test equipment according to claim 1 wherein:
   said first interface board comprises a prober interface board; and
   said device board comprises a probecard.

4. Automatic test equipment according to claim 1 wherein:
   said connectors comprise elastomeric connectors.

5. A method of interfacing a probecard to a prober interface board, the prober interface board formed with a hard stop, the method including the step:
   anchoring a top-side stiffener to the probe card, the stiffener formed with a predetermined reference height and projecting vertically in the direction of the prober interface board, the top-side stiffener including a defined reference plane for engaging the hard stop;
   interposing a low-profile interconnect array between the probecard and the prober interface board; and
   compressing the probecard against the interconnect array until stopped by the hard stop, the comprising step further comprising providing compliance no greater than 0.038 inch.

* * * * *